(12) United States Patent
Wang et al.

(10) Patent No.: US 12,106,104 B2
(45) Date of Patent: Oct. 1, 2024

(54) PROCESSOR INSTRUCTIONS FOR DATA COMPRESSION AND DECOMPRESSION

(71) Applicant: Intel Corporation, Santa Clara, CA (US)

(72) Inventors: Zhe Wang, Portland, OR (US); Alaa R. Alameldeen, Hillsboro, OR (US); Christopher J. Hughes, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 674 days.

(21) Appl. No.: 17/133,328

(22) Filed: Dec. 23, 2020

(65) Prior Publication Data

US 2022/0197642 A1    Jun. 23, 2022

(51) Int. Cl.
*G06F 9/30* (2018.01)
*G06F 12/0862* (2016.01)
*H03M 7/30* (2006.01)

(52) U.S. Cl.
CPC ...... *G06F 9/30047* (2013.01); *G06F 9/30145* (2013.01); *G06F 12/0862* (2013.01); *H03M 7/30* (2013.01); *G06F 2212/602* (2013.01)

(58) Field of Classification Search
CPC ............. G06F 9/30047; G06F 9/30145; G06F 12/0862; G06F 2212/602; H03M 7/30
See application file for complete search history.

(56) References Cited

U.S. PATENT DOCUMENTS

| | | | | |
|---|---|---|---|---|
| 6,618,506 B1 * | 9/2003 | Auerbach | ............... | H03M 7/30 712/210 |
| 6,748,520 B1 * | 6/2004 | Maynard | ................. | H03M 7/30 341/51 |

(Continued)

FOREIGN PATENT DOCUMENTS

| | | | | |
|---|---|---|---|---|
| CN | 1326033 C | * | 7/2007 | ......... G06F 9/30014 |
| CN | 103793201 A | * | 5/2014 | .......... G06F 12/0811 |

(Continued)

OTHER PUBLICATIONS

Akin et al, "ZCOMP: Reducing DNN Cross-Layer Memory Footprint Using Vector Extensions", In Proceedings of the 52nd Annual IEEE/ACM International Symposium on Microarchitecture Oct. 12, 2019, 13 pages.

(Continued)

*Primary Examiner* — Cheng Yuan Tseng
(74) *Attorney, Agent, or Firm* — NICHOLSON DE VOS WEBSTER & ELLIOTT LLP

(57) ABSTRACT

A processor that includes compression instructions to compress multiple adjacent data blocks of uncompressed read-only data stored in memory into one compressed read-only data block and store the compressed read-only data block in multiple adjacent blocks in the memory is provided. During execution of an application to operate on the read-only data, one of the multiple adjacent blocks storing the compressed read-only block is read from memory, stored in a prefetch buffer and decompressed in the memory controller. In response to a subsequent request during execution of the application for an adjacent data block in the compressed read-only data block, the uncompressed adjacent block is read directly from the prefetch buffer.

25 Claims, 16 Drawing Sheets

(56) References Cited

U.S. PATENT DOCUMENTS

| | | | | |
|---|---|---|---|---|
| 6,865,664 | B2* | 3/2005 | Budrovic | G06F 9/30178 |
| | | | | 712/210 |
| 7,552,316 | B2* | 6/2009 | Hussain | G06F 9/3851 |
| | | | | 712/208 |
| 7,773,005 | B2* | 8/2010 | Frank | H03M 7/40 |
| | | | | 341/67 |
| 10,365,892 | B2* | 7/2019 | Carlough | G06F 7/4991 |
| 2014/0208068 | A1* | 7/2014 | Wegener | H03M 7/3059 |
| | | | | 712/22 |
| 2022/0197642 | A1* | 6/2022 | Wang | G06F 9/383 |

FOREIGN PATENT DOCUMENTS

| | | | | |
|---|---|---|---|---|
| WO | WO-2014116712 | A1 * | 7/2014 | G06F 7/38 |
| WO | 2020190799 | A2 | 9/2020 | |
| WO | WO-2020190798 | A1 * | 9/2020 | G06F 12/0215 |
| WO | WO-2020190807 | A1 * | 9/2020 | G06F 12/0215 |

OTHER PUBLICATIONS

Alameldeen et al, "Frequent Pattern Compression: A Significance-Based Compression Scheme for L2 Caches", Technical Report 1500, Computer Sciences Dept., UW-Madison, Apr. 2004, 14 pages.

Alameldeen et al, "Opportunistic Compression for Direct-Mapped DRAM Caches", MEMSYS '18: Proceedings of the International Symposium on Memory Systems, Oct. 2018, 8 pages.

Choukse et al, "Compresso: Pragmatic Main Memory Compression", 2018 51st Annual IEEE/ACM International Symposium on Microarchitecture, Oct. 2018, 13 pages.

Hong et al, "Attache: Towards Ideal Memory Compression by Mitigating Metadata Bandwidth Overheads", In 2018 51st Annual IEEE/ACM International Symposium on Microarchitecture (MICRO) Oct. 20, 2018, 13 pages.

Kim et al, "Bit-Plane Compression: Transforming Data for Better Compression in Many-Core Architectures", 2016 ACM/IEEE 43rd Annual International Symposium on Computer Architecture (ISCA), Jun. 2016, 12 pages.

Pekhimenko et al, "Base-Delta-Immediate Compression: Practical Data Compression for On-Chip Caches", In 2012 21st International Conference on Parallel Architectures and Compilation Techniques (PACT), Sep. 19, 2012, 12 pages.

Qian et al, "CMH: Compression Management for Improving Capacity in the Hybrid Memory Cube", In Proceedings of the 15th ACM International Conference on Computing Frontiers, May 8, 2018, 8 pages.

Villa et al, "Dynamic Zero Compression for Cache Energy Reduction", In Proceedings of the 33rd annual IEEE/ACM International symposium on Microarchitecture, Dec. 1, 2000, 7 pages.

Yang, "Frequent Value Compression in Data Caches", In Proceedings of the 33rd annual ACM/IEEE international symposium on Microarchitecture, Dec. 1, 2000, 8 pages.

Young et al, "Enabling Transparent Memory-Compression for Commodity Memory Systems", 2019 IEEE International Symposium on High Performance Computer Architecture (HPCA), Feb. 2019, 12 pages.

Extended European Search Report for Patent Application No. 21197313.6, dated Feb. 24, 2022, 10 pages.

European First Office Action, (EP Exam Report Article 94(3) EPC), for Patent Application No. 21197313.6, dated Jan. 25, 2023, 7 pages.

European Second Office Action, (EP Exam Report Article 94(3) EPC), for Patent Application No. 21197313.6, Mailed Mar. 21, 2024, 9 pages.

* cited by examiner

PROCESSOR INSTRUCTIONS FOR DATA COMPRESSION AND DECOMPRESSION

FIELD

This disclosure relates to computer processor architecture, and, more specifically, to processor instructions for data compression and decompression.

BACKGROUND

Memory bandwidth and latency are a performance bottleneck for many workloads in a computer system. Improving memory efficiency in the computer system can improve system performance and reduce energy consumption. A cache memory can amplify memory bandwidth and reduce effective memory latency. However, a cache memory has limited capacity.

BRIEF DESCRIPTION OF THE DRAWINGS

Features of embodiments of the claimed subject matter will become apparent as the following detailed description proceeds, and upon reference to the drawings, in which like numerals depict like parts, and in which:

Figure 1:
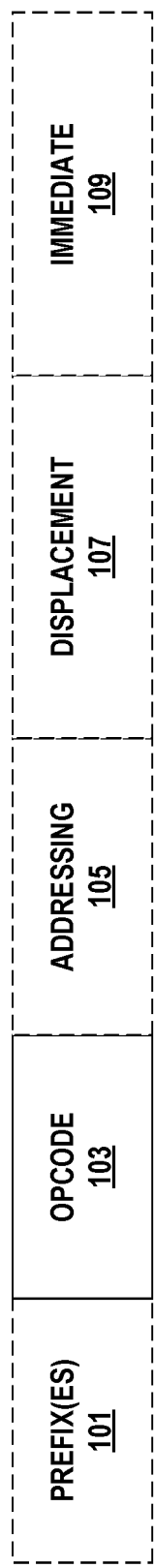
FIG. 1 illustrates embodiments of an instruction format.

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

Memory compression techniques to compress memory data are known. Many of these memory compression techniques focus on compressing data to be stored in memory to increase the effective memory capacity. These techniques either require operating system (OS) defragmentation, which incurs performance overhead, or potentially reduce the effective memory bandwidth due to metadata access overhead. Storing compressed data in a cache effectively expands the size of cache and increases the effective bandwidth of the cache.

In a deep learning system, a neural network model is stored in memory and computational logic in a processor performs multiply-accumulate (MAC) computations on the parameters (for example, neural network weights) stored in the memory. Data transfer between memory and the processor is an energy-intensive process and can consume up to 90% of the power in machine learning workloads.

The neural network weights are read-only data, that is, they do not change during execution of machine learning inference workloads. Other applications that operate on read-only data include a read-only database that allows users to read but not modify data. The read-only data used by applications is data that typically is not modified or deleted during execution of the application in the computer system.

In an embodiment, a processor compression instruction compresses multiple adjacent data blocks of uncompressed read-only data stored in memory into one compressed read-only data block and stores the compressed read-only data block in multiple adjacent blocks in the memory. During execution of an application to operate on the read-only data, one of the multiple adjacent blocks storing the compressed read-only block is read from memory, stored in a prefetch buffer and decompressed in the memory controller. In response to a subsequent request during execution of the application for an adjacent data block in the compressed read-only data block, the uncompressed adjacent block is read directly from the prefetch buffer.

The compression of multiple adjacent data blocks of read-only data improves the effective memory bandwidth and reduces memory access latency for read-only data resulting in improved performance and lower memory energy consumption for applications using the read-only data. The read-only data can be stored in a dual inline memory module (DIMM) with Dynamic Random Access Memory (DRAM). The compression of the multiple adjacent data blocks of read-only data can be performed using general compression algorithms, for example, Bit-Plane Compression, Base-delta-immediate compression, Frequent Value Compression.

Compressed data can also be stored in cache memory to improve effective cache and mesh bandwidth of the "mesh" on-chip interconnect topology. The compression and decompression of the read-only data is performed by instructions in a processor.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

An instruction set may include one or more instruction formats. A given instruction format can define various fields (for example, number of bits, location of bits) to specify, among other things, the operation to be performed (for example, opcode) and the operand(s) on which that operation is to be performed and/or other data field(s) (for example, mask). Some instruction formats are further broken down though the definition of instruction templates (or sub formats). For example, the instruction templates of a given instruction format can be defined to have different subsets of the instruction format's fields (the included fields are typically in the same order, but at least some have different bit positions because there are less fields included) and/or defined to have a given field interpreted differently. Thus, each instruction of an instruction set architecture (ISA) is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream has specific contents in the operand fields that select specific operands.

FIG. 1 illustrates embodiments of an instruction format. As illustrated, an instruction may include multiple components including, but not limited to, one or more fields for: one or more prefixes 101, an opcode 103, addressing field 105 (for example, register identifiers, memory addressing information, etc.), a displacement value 107, and/or an immediate 109. Note that some instructions utilize some or all of the fields of the format whereas others may only use the field for the opcode 103. In some embodiments, the order illustrated is the order in which these fields are to be encoded, however, it should be appreciated that in other embodiments these fields may be encoded in a different order, combined, etc.

The prefix(es) field(s) 101, when used, modifies an instruction. In some embodiments, one or more prefixes are used to repeat string instructions (for example, 0xF0, 0xF2, 0xF3, etc.), to provide section overrides (for example, 0x2E, 0x36, 0x3E, 0x26, 0x64, 0x65, 0x2E, 0x3E, etc.), to perform bus lock operations, and/or to change operand (for example, 0x66) and address sizes (for example, 0x67). Certain instructions require a mandatory prefix (for example, 0x66, 0xF2, 0xF3, etc.). Certain of these prefixes may be considered "legacy" prefixes. Other prefixes, one or more examples of which are detailed herein, indicate, and/or provide further capability, such as specifying particular registers, etc. The other prefixes typically follow the "legacy" prefixes.

The opcode field 103 is used to, at least partially define the operation to be performed upon a decoding of the instruction. In some embodiments, a primary opcode encoded in the opcode field 103 is 1, 2, or 3 bytes in length. In other embodiments, a primary opcode can be a different length. An additional 3-bit opcode field is sometimes encoded in another field.

The addressing field 105 is used to address one or more operands of the instruction, such as a location in memory or one or more registers.

Figure 2:
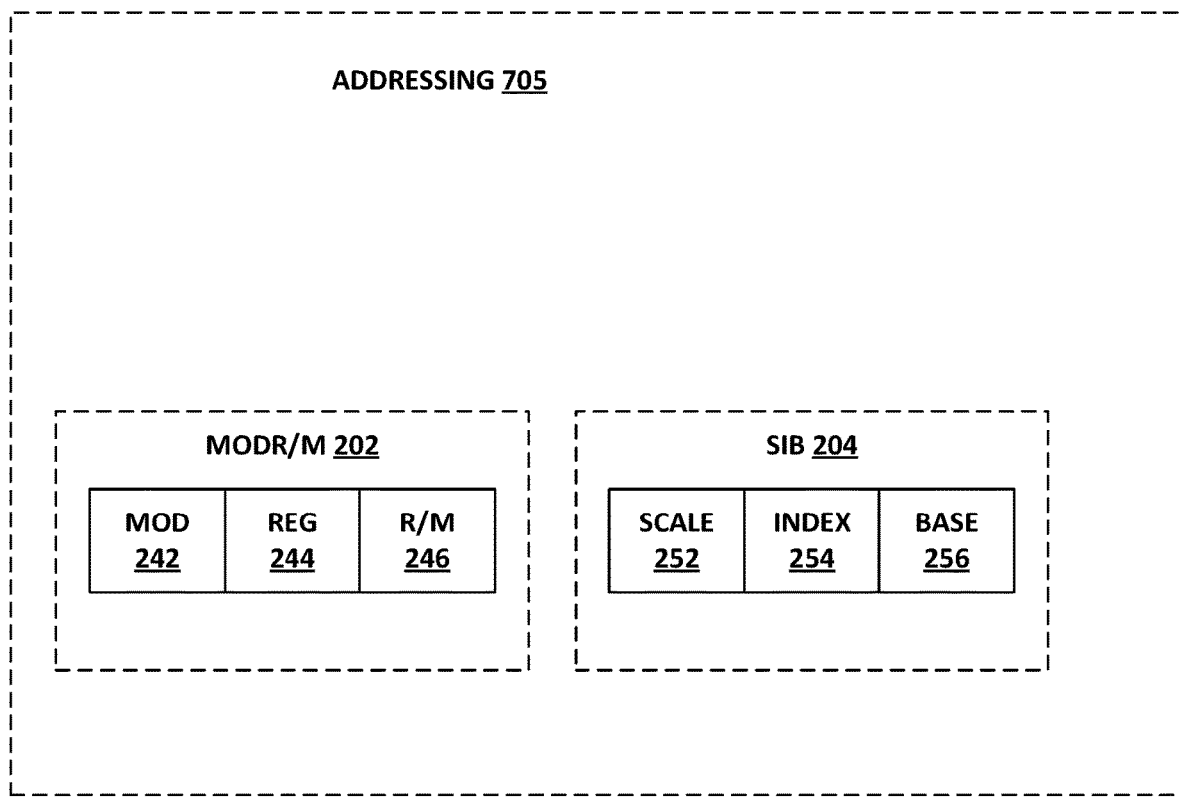
FIG. 2 illustrates embodiments of the addressing field.

FIG. 2 illustrates embodiments of the addressing field 105. In this illustration, an optional ModR/M byte 202 and an optional Scale, Index, Base (SIB) byte 204 are shown. The ModR/M byte 202 and the SIB byte 204 are used to encode up to two operands of an instruction, each of which is a direct register or effective memory address. Note that each of these fields are optional in that not all instructions include one or more of these fields. The MOD R/M byte 202 includes a MOD field 242, a register field 244, and R/M field 246.

The content of the MOD field 242 distinguishes between memory access and non-memory access modes. In some embodiments, when the MOD field 242 has a value of binary (b) 11, a register-direct addressing mode is utilized, and otherwise register-indirect addressing is used.

The register field 244 may encode either the destination register operand or a source register operand, or may encode an opcode extension and not be used to encode any instruction operand. The content of register index field 244, directly or through address generation, specifies the locations of a source or destination operand (either in a register or in memory). In some embodiments, the register field 244 is supplemented with an additional bit from a prefix (for example, prefix 101) to allow for greater addressing.

The R/M field 246 may be used to encode an instruction operand that references a memory address, or may be used to encode either the destination register operand or a source register operand. Note the R/M field 246 may be combined with the MOD field 242 to dictate an addressing mode in some embodiments.

The SIB byte 204 includes a scale field 252, an index field 254, and a base field 256 to be used in the generation of an address. The scale field 252 indicates scaling factor. The index field 254 specifies an index register to use. In some embodiments, the index field 254 is supplemented with an additional bit from a prefix (for example, prefix 101) to allow for greater addressing. The base field 256 specifies a base register to use. In some embodiments, the base field 256 is supplemented with an additional bit from a prefix (for example, prefix 101) to allow for greater addressing. In practice, the content of the scale field 252 allows for the scaling of the content of the index field 254 for memory address generation (for example, for address generation that uses $2^{scale}*index+base$).

Some addressing forms utilize a displacement value to generate a memory address. For example, a memory address may be generated according to $2^{scale}*index+base+displacement$, index*scale+displacement, r/m+displacement, instruction pointer (RIP/EIP)+displacement, register+displacement, etc. The displacement may be a 1-byte, 2-byte, 4-byte, etc. value. In some embodiments, a displacement field 107 provides this value. Additionally, in some embodiments, a displacement factor usage is encoded in the MOD field of the addressing field 105 that indicates a compressed displacement scheme for which a displacement value is calculated by multiplying disp8 in conjunction with a scaling factor N that is determined based on the vector length, the value of a b bit, and the input element size of the instruction. The displacement value is stored in the displacement field 107.

In some embodiments, an immediate field 109 specifies an immediate for the instruction. An immediate may be encoded as a 1-byte value, a 2-byte value, a 4-byte value, etc.

Embodiments of the processor compression instructions include one or more of the fields detailed above. For example, VHWCOMPRESS is a mnemonic of the opcode encoded in opcode field 103. The VHWCOMPRESS instruction may also include a prefix 101 to further modify the instruction (for example, dictate operand sizes, etc.).

The address (discussed as [addr] above) is provided by addressing field(s) 105. The address may be stored in a register (such as a register identified by REG 244), provided using one or more of SIB addressing (for example, using SIB byte 204), the R/M field 246, the displacement field 107, etc.

How the depth is provided may also vary by embodiment. For example, the depth may be stored in a register (for example, as indicated by REG 244 or R/M 246) or directly encoded using the immediate field 109.

The table below provides examples of where the address and depth are located or referenced:

| Opcode | Address | Depth |
|---|---|---|
| VHWCOMPRESS | Memory addressing | Register |

Figure 3:
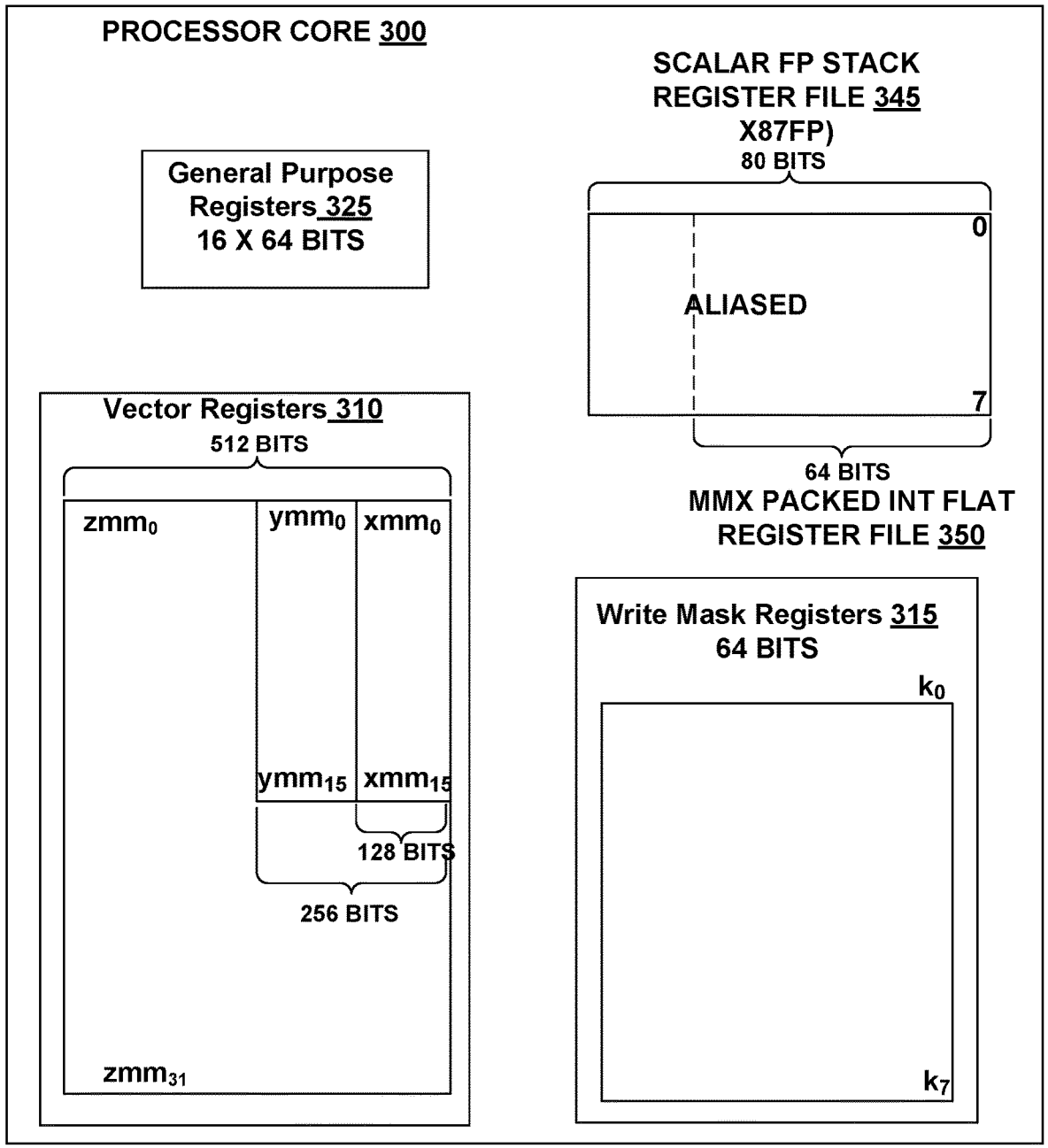
FIG. 3 is a block diagram of a register architecture according to some embodiments.

FIG. 3 is a block diagram of a processor core 300 according to some embodiments. In the embodiment illustrated, there are 32 vector registers 310 that are 512 bits wide; these registers are referenced as zmm0 through zmm31. The lower order 256 bits of the lower 16 zmm registers are overlaid on registers ymm0-15. The lower order 128 bits of the lower 16 zmm registers (the lower order 128 bits of the ymm registers) are overlaid on registers xmm0-15.

In the embodiment illustrated, there are 8 write mask registers 315 that are each 64 bits in size; these registers are referenced as k0 through k7. In an alternate embodiment, the write mask registers 315 are 16 bits in size. In some embodiments, the vector mask register k0 cannot be used as a write mask; when the encoding that would normally indicate k0 is used for a write mask, it selects a hardwired write mask of 0xffff, effectively disabling write masking for that instruction.

In the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

In the embodiment illustrated, the scalar floating-point stack register file x87 stack 345, on which is aliased the MMX packed integer flat register file 350 is an eight-element stack used to perform scalar floating-point operations on 32/64/80-bit floating-point data using the x87 instruction set extension; while the MMX registers are used to perform operations on 64-bit packed integer data, as well as to hold operands for some operations performed between the MMX and XMM registers.

Alternative embodiments may use wider or narrower registers. Additionally, alternative embodiments may use more, less, or different register files and registers.

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Figure 4A:
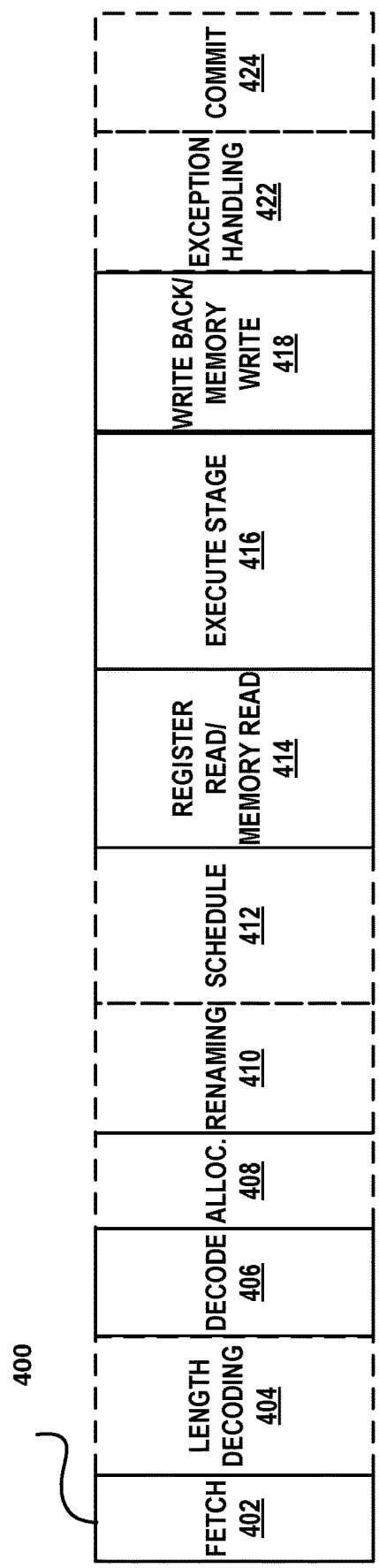
FIG. 4A is a block diagram illustrating both an exemplary in-order pipeline and an exemplary register renaming, out-of-order issue/execution pipeline.
Figure 4B:
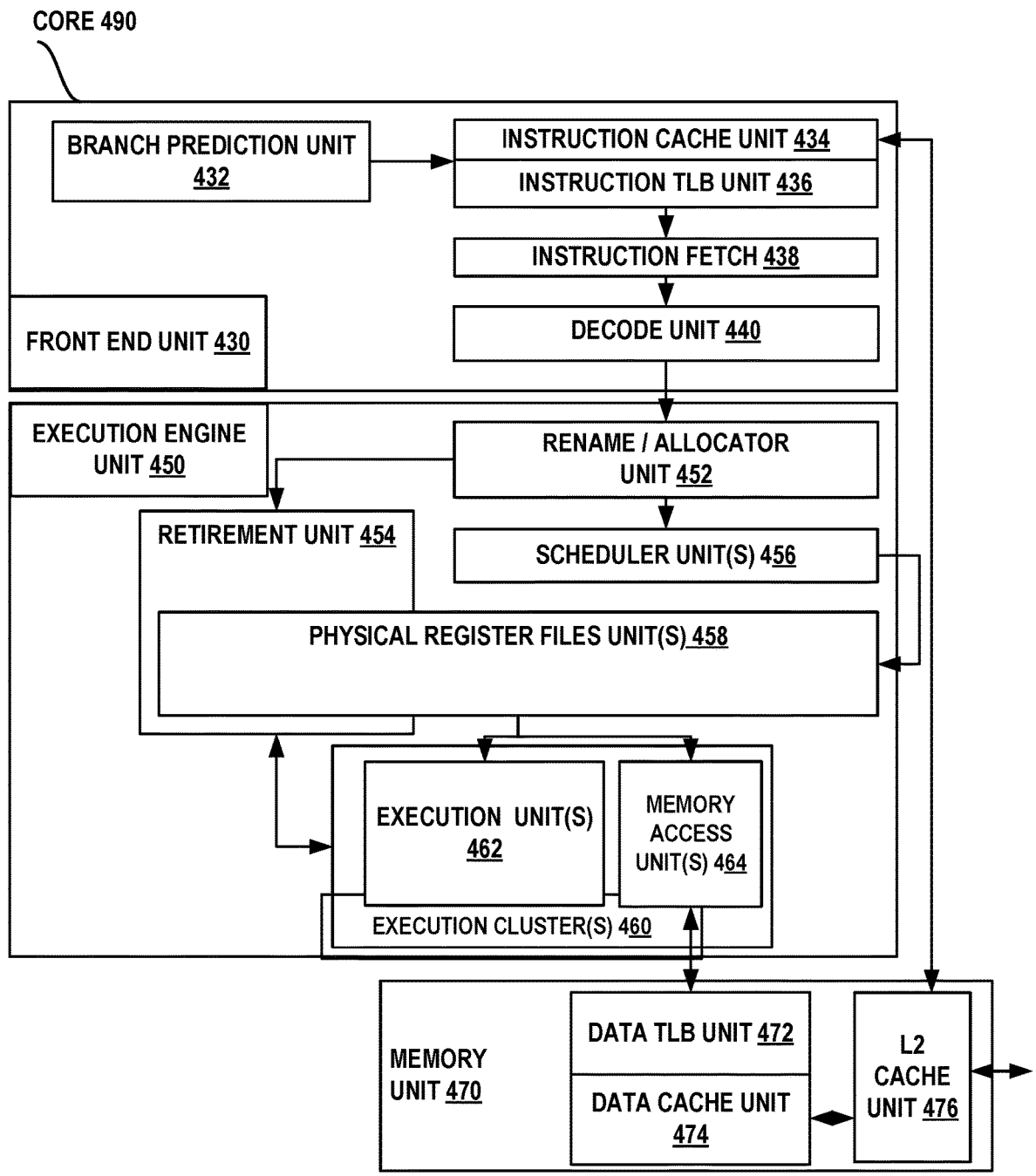
FIG. 4B is a block diagram illustrating both an exemplary embodiment of an in-order architecture core and an exemplary register renaming, out-of-order issue/execution architecture core to be included in a processor.

FIG. 4A is a block diagram illustrating both an exemplary in-order pipeline and an exemplary register renaming, out-of-order issue/execution pipeline. FIG. 4B is a block diagram illustrating both an exemplary embodiment of an in-order architecture core and an exemplary register renaming, out-of-order issue/execution architecture core to be included in a processor. The solid lined boxes in FIGS. 4A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

A processor pipeline 400 includes a fetch stage 402, a length decode stage 404, a decode stage 406, an allocation stage 408, a renaming stage 410, a scheduling (also known as a dispatch or issue) stage 412, a register read/memory read stage 414, an execute stage 416, a write back/memory write stage 418, an exception handling stage 422, and a commit stage 424.

Turning to FIG. 4B a processor core 490 including a front end unit 430 is coupled to an execution engine unit 450, and both are coupled to a memory unit 470. The core 490 may be a reduced instruction set computing (RISC) core, a complex instruction set computing (CISC) core, a very long instruction word (VLIW) core, or a hybrid or alternative core type. As yet another option, the core 490 may be a special-purpose core, such as, for example, a network or communication core, compression engine, coprocessor core, general purpose computing graphics processing unit (GPGPU) core, graphics core, or the like.

The front end unit 430 includes a branch prediction unit 432 coupled to an instruction cache unit 434, which is coupled to an instruction translation lookaside buffer (TLB)

436, which is coupled to an instruction fetch unit 438, which is coupled to a decode unit 440. The decode unit 440 (or decoder) can decode instructions, and generate as an output one or more micro-operations, micro-code entry points, microinstructions, other instructions, or other control signals, which are decoded from, or which otherwise reflect, or are derived from, the original instructions. The decode unit 440 can be implemented using various different mechanisms. Examples of suitable mechanisms include, but are not limited to, look-up tables, hardware implementations, programmable logic arrays (PLAs), microcode read only memories (ROMs), etc. In one embodiment, the core 490 includes a microcode ROM or other medium that stores microcode for certain macroinstructions (for example, in decode unit 440 or otherwise within the front end unit 430). The decode unit 440 is coupled to a rename/allocator unit 452 in the execution engine unit 450.

The execution engine unit 450 includes the rename/allocator unit 452 coupled to a retirement unit 454 and a set of one or more scheduler unit(s) 456. The scheduler unit(s) 456 represents any number of different schedulers, including reservations stations, central instruction window, etc. The scheduler unit(s) 456 is coupled to the physical register file(s) unit(s) 458. Each of the physical register file(s) units 458 represents one or more physical register files, different ones of which store one or more different data types, such as scalar integer, scalar floating-point, packed integer, packed floating-point, vector integer, vector floating-point, status (for example, an instruction pointer that is the address of the next instruction to be executed), etc. The physical register file(s) unit 458 comprises a vector registers unit, a write mask registers unit, and a scalar registers unit. These register units may provide architectural vector registers, vector mask registers, and general purpose registers. The physical register file(s) unit(s) 458 is overlapped by the retirement unit 454 to illustrate various ways in which register renaming and out-of-order execution may be implemented (for example, using a reorder buffer(s) and a retirement register file(s); using a future file(s), a history buffer(s), and a retirement register file(s); using a register maps and a pool of registers; etc.). The retirement unit 454 and the physical register file(s) unit(s) 458 are coupled to the execution cluster(s) 460. The execution cluster(s) 460 includes a set of one or more execution units 462 and a set of one or more memory access units 464. The execution units 462 may perform various operations (for example, shifts, addition, subtraction, multiplication) and on various types of data (for example, scalar floating-point, packed integer, packed floating-point, vector integer, vector floating-point). While some embodiments may include a number of execution units dedicated to specific functions or sets of functions, other embodiments may include only one execution unit or multiple execution units that all perform all functions. The scheduler unit(s) 456, physical register file(s) unit(s) 458, and execution cluster(s) 460 are shown as being possibly plural because certain embodiments create separate pipelines for certain types of data/operations (for example, a scalar integer pipeline, a scalar floating-point/packed integer/packed floating-point/vector integer/vector floating-point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 464). It should also be understood that where separate pipelines are used, one or more of these pipelines may be out-of-order issue/execution and the rest in-order.

The set of memory access units 464 is coupled to the memory unit 470, which includes a data TLB unit 472 coupled to a data cache unit 474 coupled to a level 2 (L2) cache unit 476. The memory access units 464 can include a load unit, a store address unit, and a store data unit, each of which is coupled to the data TLB unit 472 in the memory unit 470. The instruction cache unit 434 is further coupled to a level 2 (L2) cache unit 476 in the memory unit 470. The L2 cache unit 476 is coupled to one or more other levels of cache and eventually to a main memory.

By way of example, the exemplary register renaming, out-of-order issue/execution core architecture may implement the pipeline 400 as follows: 1) the instruction fetch unit 438 performs the fetch and length decoding stages 402 and 404; 2) the decode unit 440 performs the decode stage 406; 3) the rename/allocator unit 452 performs the allocation stage 408 and renaming stage 410; 4) the scheduler unit(s) 456 performs the schedule stage 412; 5) the physical register file(s) unit(s) 458 and the memory unit 470 perform the register read/memory read stage 414; the execution cluster 460 perform the execute stage 416; 6) the memory unit 470 and the physical register file(s) unit(s) 458 perform the write back/memory write stage 418; 7) various units may be involved in the exception handling stage 422; and 8) the retirement unit 454 and the physical register file(s) unit(s) 458 perform the commit stage 424. The core 490 may support one or more instructions sets (for example, the x86 instruction set (with some extensions that have been added with newer versions); the MIPS instruction set of MIPS Technologies of Sunnyvale, CA; the ARM instruction set (with optional additional extensions such as NEON) of ARM Holdings of Sunnyvale, CA), including the instruction(s) described herein. The core 490 includes logic to support Advanced Vector Extensions (AVX), for example, AVX2 and AVX-512. AVX2 expands integer commands to 256 bits. AVX-512 are 512-bit extensions to the 256-bit Advanced Vector Extensions Single instruction, multiple data (SIMD) instructions for x86 instruction set architecture. AVX-512 instructions use the 512-bit vector registers zmm0 through zmm31 in vector registers 310.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (for example, time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 434/474 and a shared L2 cache unit 476, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figures 5A, 5B:
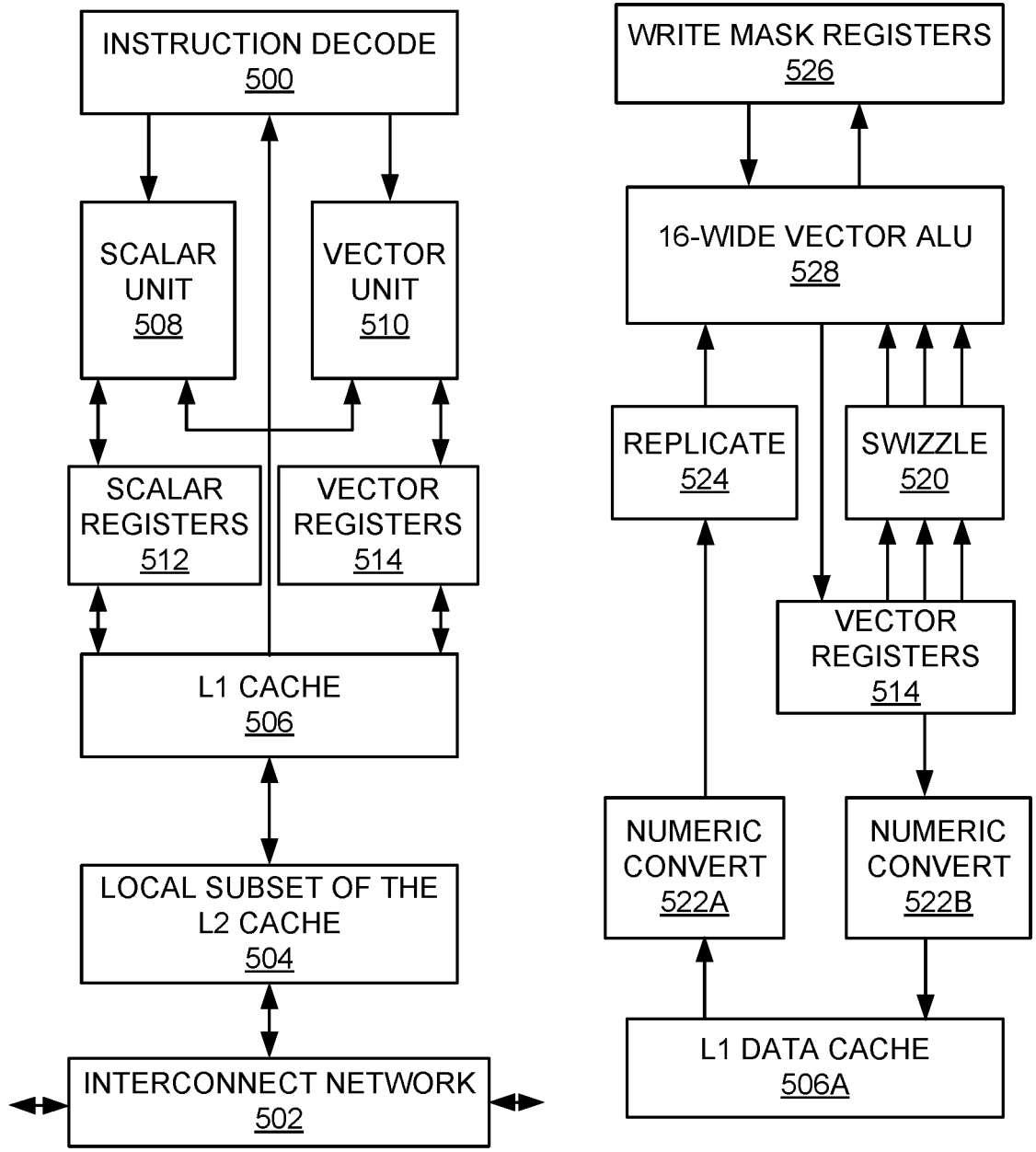
FIG. 5A is a block diagram of a single processor core, along with its connection to the on-die interconnect network and with its local subset of the Level 2 (L2) cache, according to some embodiments of the invention.
FIG. 5B is an expanded view of a portion of the processor core in FIG. 5A.

FIGS. 5A-B illustrate a block diagram of a more specific exemplary in-order core architecture, which core would be one of several logic blocks (including other cores of the same type and/or different types) in a chip. The logic blocks communicate through a high-bandwidth interconnect network (for example, a ring network) with some fixed function logic, memory I/O interfaces, and other necessary I/O logic, depending on the application.

FIG. 5A is a block diagram of a single processor core, along with its connection to the on-die interconnect network 502 and with its local subset of the Level 2 (L2) cache 504, according to some embodiments of the invention. In one embodiment, an instruction decoder 500 supports the x86 instruction set with a packed data instruction set extension (for example, AVX-512). An L1 cache 506 allows low-latency accesses to cache memory into the scalar and vector units. While in one embodiment (to simplify the design), a scalar unit 508 and a vector unit 510 use separate register sets (respectively, scalar registers 512 and vector registers 514) and data transferred between them is written to memory and then read back in from a level 1 (L1) cache 506, alternative embodiments of the invention may use a different approach (for example, use a single register set or include a communication path that allow data to be transferred between the two register files without being written and read back).

The local subset of the L2 cache 504 is part of a global L2 cache that is divided into separate local subsets, one per processor core. Each processor core has a direct access path to its own local subset of the L2 cache 504. Data read by a processor core is stored in its L2 cache subset 504 and can be accessed quickly, in parallel with other processor cores accessing their own local L2 cache subsets. Data written by a processor core is stored in its own L2 cache subset 504 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 5B is an expanded view of a portion of the processor core in FIG. 5A. FIG. 5B includes an L1 data cache 506A portion of the L1 cache 506, as well as more detail regarding the vector unit 510 and the vector registers 514. Specifically, the vector unit 510 is a 16-wide vector processing unit (VPU) (see the 16-wide ALU 528), which executes one or more of integer, single-precision float, and double-precision float instructions. The VPU supports swizzling the register inputs with swizzle unit 520, numeric conversion with numeric convert units 522A and 522B, and replication with replication unit 524 on the memory input. Write mask registers 526 allow predicating resulting vector writes.

Figure 6:
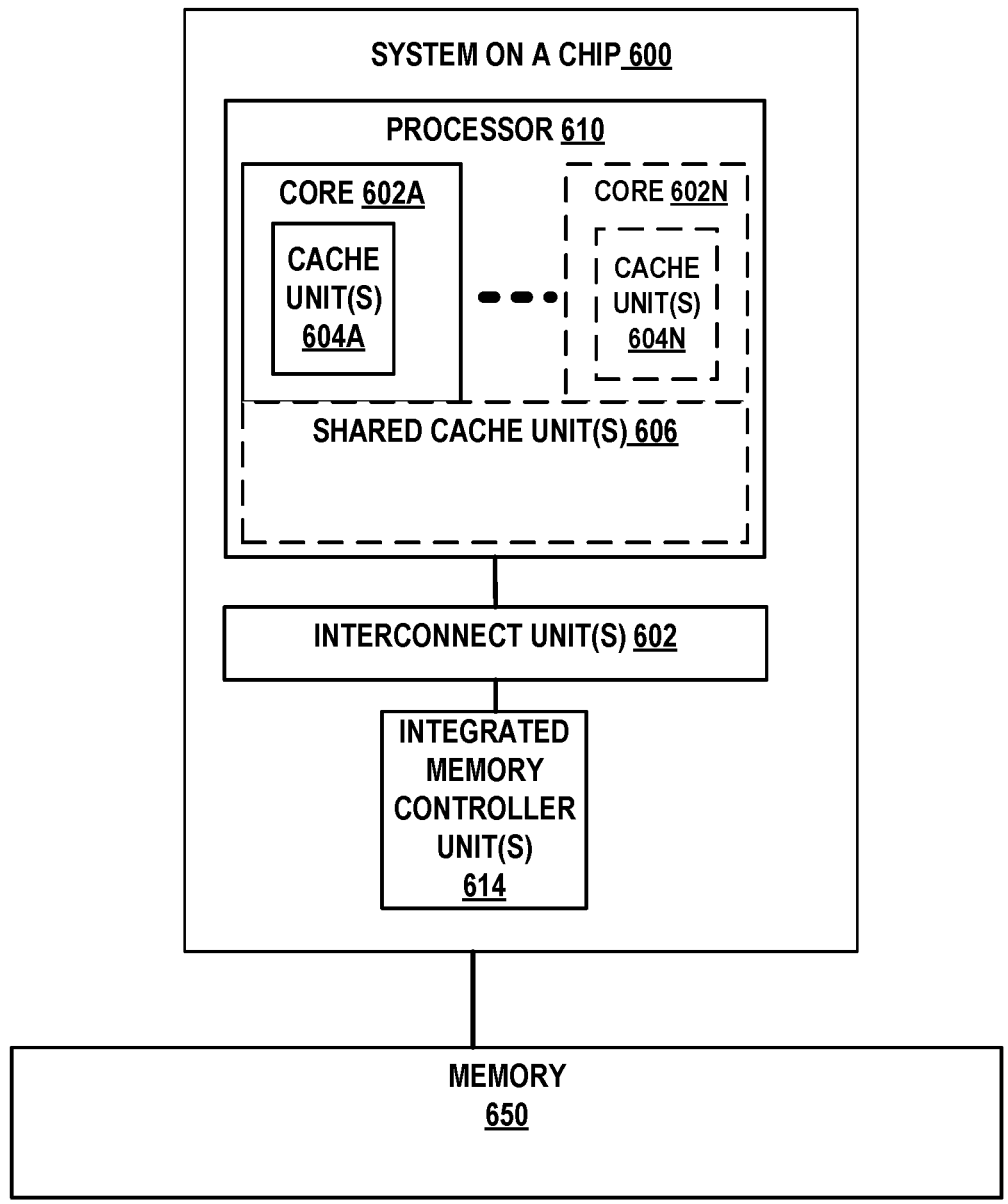
FIG. 6 is a block diagram of a System on Chip (SoC)

FIG. 6 is a block diagram of a System on Chip (SoC) 600. Similar elements in FIG. 6 bear like reference numerals. Also, dashed lined boxes are optional features on more advanced SoCs.

An interconnect unit(s) 602 is coupled to: a processor 610 which includes a set of one or more cores 602A-N, which include cache units 604A through 604N, and shared cache unit(s) 606 (also referred to as Last Level Cache (LLC)) and an integrated memory controller unit(s) 614 to couple to an external memory 650. The external memory 650 can be a volatile memory or a persistent memory.

Volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein can be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

Figure 7:
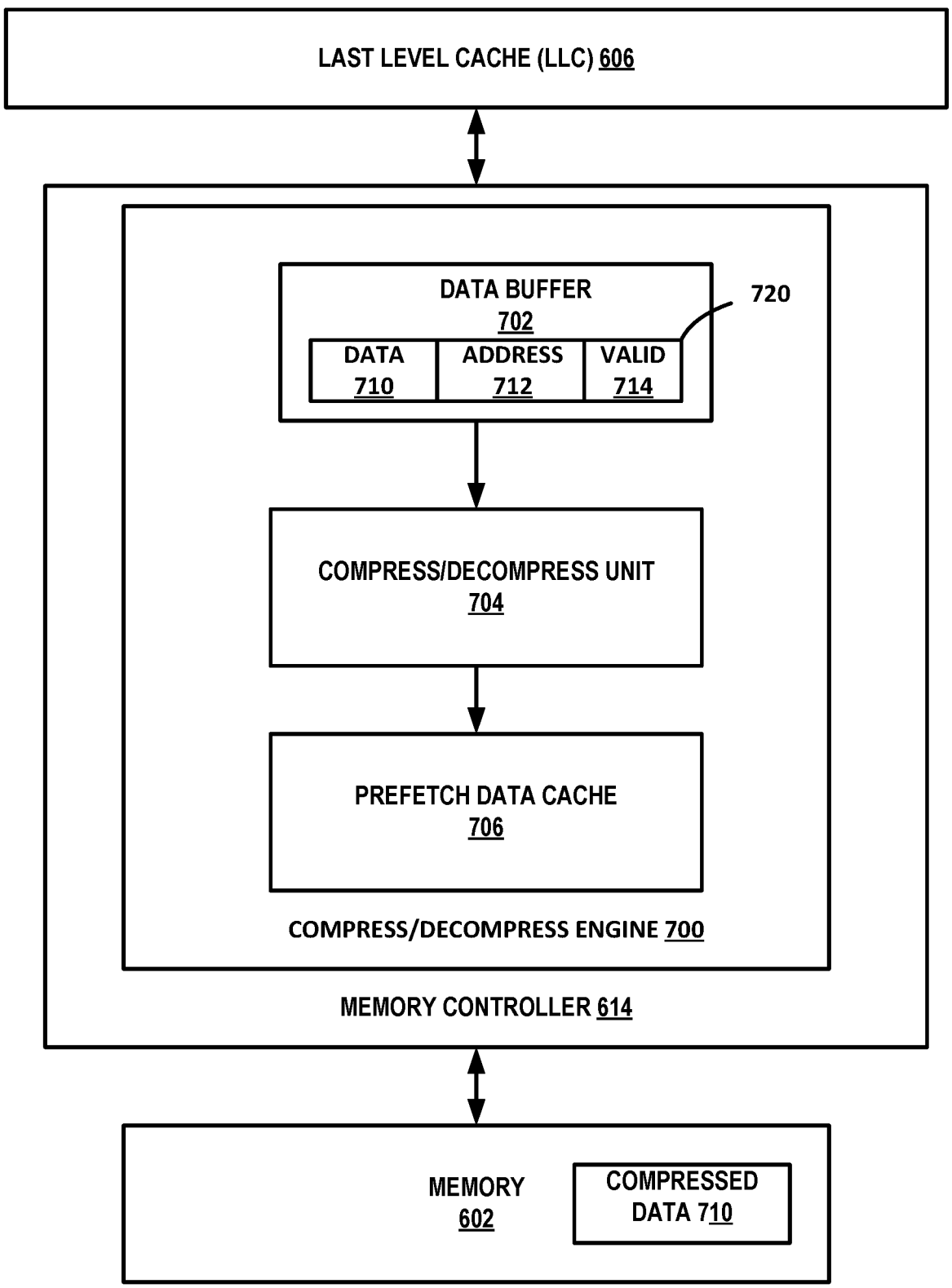
FIG. 7 is a block diagram of a portion of the SoC shown in FIG. 6 that includes a compression/decompression engine in an integrated memory controller unit in accordance with an embodiment of the present invention.

FIG. 7 is a block diagram of a portion of the SoC 600 shown in FIG. 6 that includes a compression/decompression engine 700 in an integrated memory controller unit 614 in accordance with an embodiment of the present invention. The compression/decompression engine 700 to perform data compression and data decompression.

The compression/decompression engine 700 includes a data buffer 702, a prefetch data cache 706 and a compress/decompress unit (compress/decompress circuitry) 704 to perform compression or decompression on the data stored in the data buffer 702. The compress/decompress unit 704 can use a single compression algorithm or a combination of multiple compression algorithms. Metadata stored with compressed data includes information related to the compression algorithm(s) used to compress the data.

The instruction format for the compress AVX-512 instructions is shown in the Table. The compress AVX-512 instructions use cache write through mode to bypass caches 604A-604N, 606 in the SoC 600 and store data in the data buffer 702 in the memory controller 614. Each instruction includes two or three operands (operand 1, operand 2, operand 3). Each operand is either read (r) or written (w).

| Opcode | Operand 1 | Operand 2 | Operand 3 |
|---|---|---|---|
| VHWCOMPRESS | mem(w) | zmm(r) | |
| VMOVRAWCOMPRESS | zmm(w) | reg(w) | mem(r) |
| VWRCOMPRESS | Mem(w) | zmm(r) | reg(r) |
| VHWCOMPRESSSTORE | mem(w) | reg(r) | |

Figure 8:
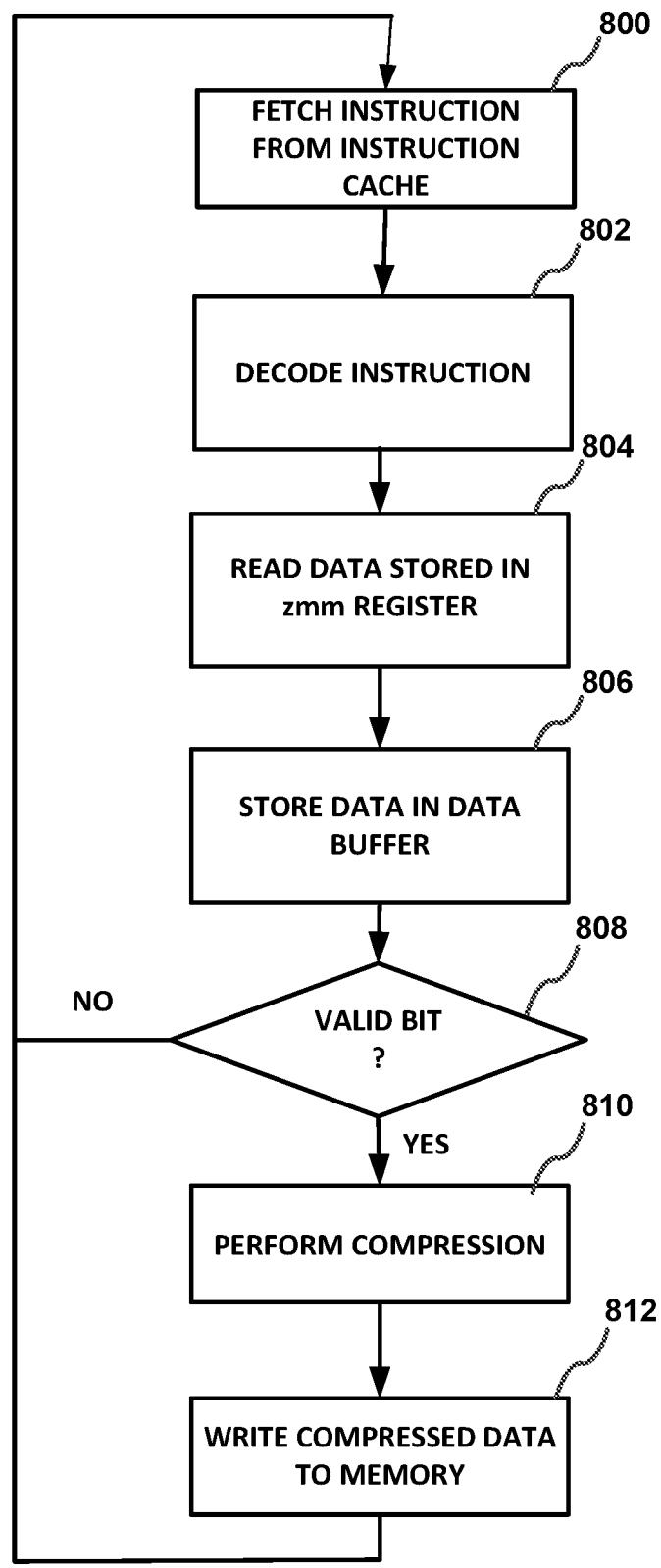
FIG. 8 is a flowgraph of the operation of the VHWCOMPRESS instruction in the SoC.

FIG. 8 is a flowgraph of the operation of the VHWCOMPRESS instruction in the SoC 600.

At block 800, the VHWCOMPRESS instruction is fetched by instruction fetch unit 438 (FIG. 4) from instruction cache 434 (FIG. 4). The VHWCOMPRESS instruction has two operands, the first operand is an address in memory 650 (memory location in memory 650), and the second operand is one of the zmm registers in vector register 310 (FIG. 3). Processing continues with block 802.

At block 802, the VHWCOMPRESS instruction is decoded in decode unit 440 (FIG. 4B). Processing continues with block 804.

At block 804, responsive to the decoded instruction, the execution unit 462 (FIG. 4B) in the execution engine unit 450 (FIG. 4B) reads the 64 bytes of data (one block of 512 bits of data) stored in the 512-bit zmm register in vector register 310 (FIG. 3). Processing continues with block 806.

At block 806, the execution unit 462 (FIG. 4B) in the execution engine unit 450 (FIG. 4B) stores the 64 bytes of data read from the zmm register in data buffer 702 (FIG. 7) in the compress/decompress engine 700 in the memory controller 614. Processing continues with block 808.

At block 808, the data buffer 702 is organized as a First-In-First-Out (FIFO) buffer. Each entry 720 in the data buffer 702 has a data field 710, a memory address field 712 and a valid bit 714. The data in the zmm register in vector registers 310 (FIG. 3) identified by the second operand of the VHWCOMPRESS instruction is written to the data field 710 in the entry 720 in the data buffer 702. The memory address identified by the first operand of the VHWCOMPRESS instruction is written to the memory address field 712 in the entry 720 in the data buffer 702. The valid bit 714 is set to logical '1' when the 512 bits (64 bytes) of data has been stored in the data field 710 to indicate that it is available for compression. If the valid bit 714 is set to logical '1', processing continues with block 810 to perform the compression of the data stored in the data field 710. If valid bits in compress data buffer entries are 1, adjacent data blocks in the data buffer are sent to the compression logic for compression. If not, processing continues with block 800 to perform another instruction.

At block 810, the 512 bits of data stored in the data field 710 in the data buffer 702 are sent to the compress/decompress unit 704 to be compressed. Processing continues with block 812.

At block 812, the compressed data and metadata associated with the compressed data is written to memory 650 at the memory address in the memory address field 712 in the entry. The metadata includes a compression bit that can be set to logical '1' to indicate that the block of data stored at the memory address in memory 650 is compressed data. In an embodiment, the compression bit in the metadata can be stored in a memory chip that also stores Error Correction Codes (ECC). Processing continues with block 800 to perform another instruction.

Figure 9A:
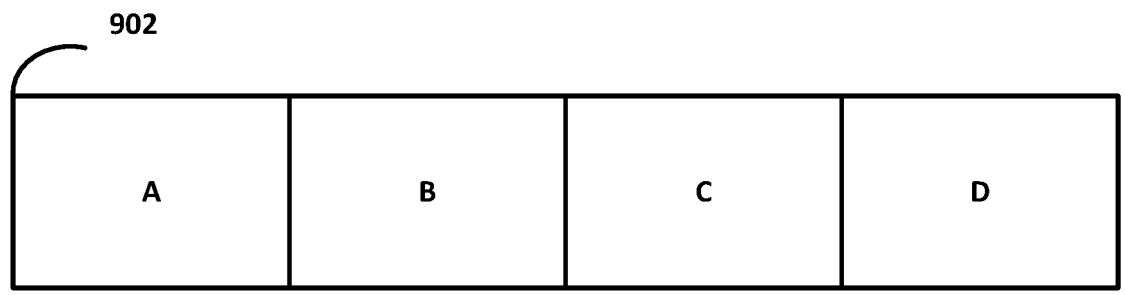
FIG. 9A illustrates uncompressed adjacent data blocks.
Figure 9B:
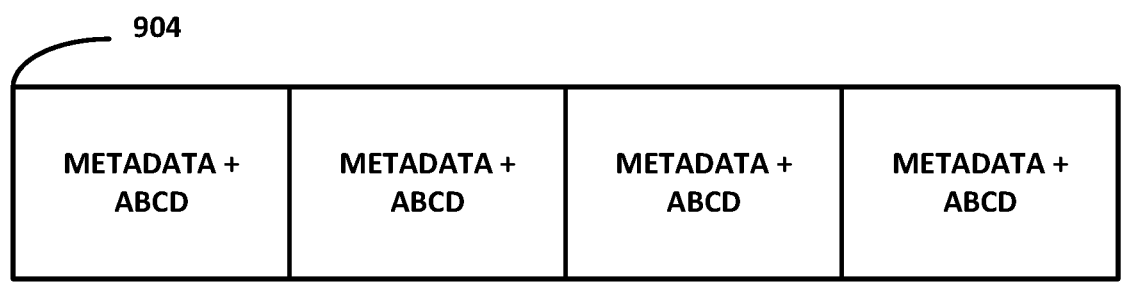
FIG. 9B illustrates compressed data and associated metadata corresponding to the uncompressed data blocks shown in FIG. 9B.

FIGS. 9A-9B illustrate an example of the format of compressed and uncompressed data stored in memory 650. FIG. 9A illustrates uncompressed adjacent data blocks. FIG. 9B illustrates compressed data and associated metadata corresponding to the uncompressed data blocks shown in FIG. 9B. The metadata is used to store the information needed to decompress the compressed data block.

FIG. 9B illustrates the compressed data format of adjacent data blocks A, B, C, D shown in FIG. 9A stored in compressed data block 904 in memory 650 resulting from the operation of the VHWCOMPRESS instruction on uncompressed block 902 shown in FIG. 9A. Compressed data block 904 stores multiple copies of compressed data (Metadata+ABCD). In the embodiment shown, there are four copies of compressed data (Metadata+ABCD). Storing multiple copies of compressed results in memory bandwidth savings between the memory controller 614 and memory 650 because a read request to access compressed adjacent blocks A, B, C or D can use the original address (the address of the original read request).

In an embodiment, the VHWCOMPRESS instruction can be used to compresses read-only data offline. A software application executing in the system can compress critical read-only data structures using VHWCOMPRESS instructions to compress each 64 byte block in the critical read-only data structures. Each of the VHWCOMPRESS instructions can write the compressed read-only data structures to the address in the memory 650 in which the uncompressed read-only data structures are stored or to another address in the memory 650. The VHWCOMPRESS instructions use a write through mode to bypass caches in the processor and store the data in the data buffer 702 in the compress/decompress engine 700.

In another embodiment, a software agent executing in the system can scan for read-only pages in memory 650 and use VHWCOMPRESS instructions to compress the data in the read-only pages.

Figure 10:
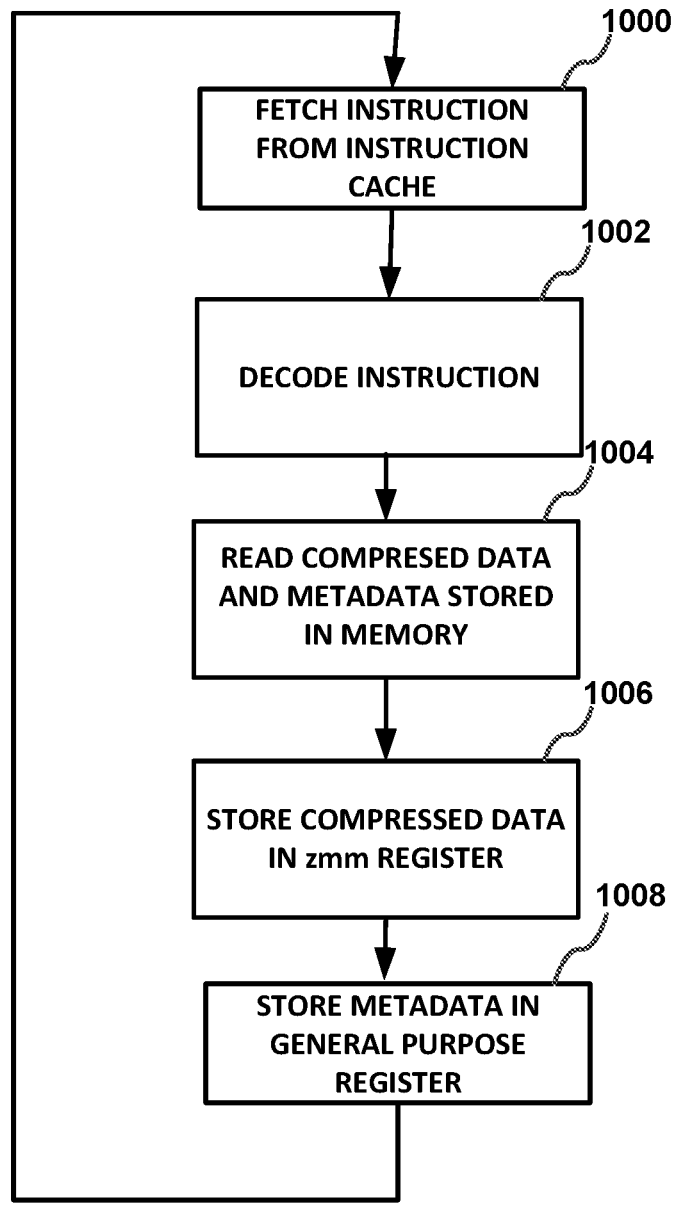
FIG. 10 is a flowgraph of the operation of the VMOVRAWCOMPRESS instruction in the SoC.

FIG. 10 is a flowgraph of the operation of the VMOVRAWCOMPRESS instruction in the SoC 600. The VMOVRAWCOMPRESS reads compressed data and associated metadata stored in a memory and stores the compressed data in a zmm register and the metadata in a general purpose register.

At block 1000, the VMOVRAWCOMPRESS instruction is fetched from instruction cache 434 (FIG. 4B) by the instruction fetch unit 438 (FIG. 4B). The VMOVRAWCOMPRESS instruction has three operands, the first operand is one of the zmm registers in vector register 310 (FIG. 3), the second operand is an address in memory 650, and the third operand is a general purpose register. Processing continues with block 1002.

At block 1002, the VMOVRAWCOMPRESS instruction is decoded in decode unit 440 (FIG. 4B). Processing continues with block 1004.

At block 1004, the execution unit 462 (FIG. 4B) in the execution engine unit 450 (FIG. 4B) reads 64 bytes of compressed data and the metadata stored in memory 650. Processing continues with block 1006.

At block 1006, the execution unit 462 (FIG. 4B) in the execution engine unit 450 (FIG. 4B) stores the 64 bytes of compressed data read from memory 650 in one of the zmm registers in vector register 310 (FIG. 3). Processing continues with block 1008.

At block 1008, the execution unit 462 (FIG. 4B) in the execution engine unit 450 (FIG. 4B) stores the metadata read from memory is stored in a general purpose register 325 (FIG. 3). Processing continues with block 1000 to fetch another instruction.

Figure 11:
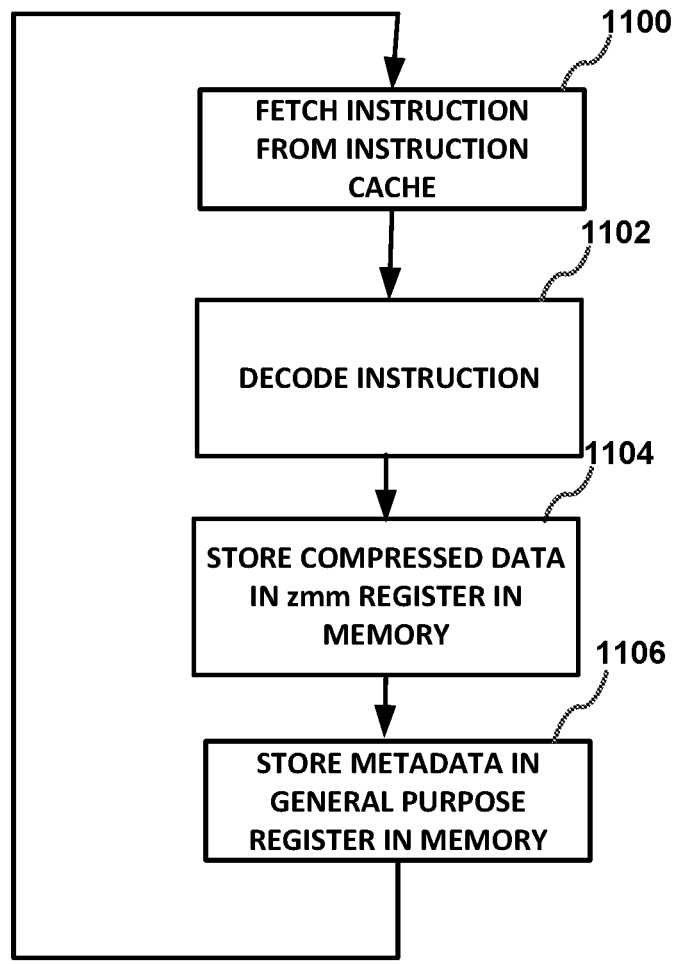
FIG. 11 is a flowgraph of the operation of the VWRCOMPRESS instruction in the SoC.

FIG. 11 is a flowgraph of the operation of the VWRCOMPRESS instruction in the SoC 600. The VWRCOMPRESS instruction writes compressed data and associated metadata to memory 650.

At block 1100, the VWRCOMPRESS instruction is fetched from instruction cache 434 (FIG. 4) by instruction fetch unit 438 (FIG. 4). The VWRCOMPRESS instruction has three operands, the first operand is an address in memory 650, the second operand is one of the zmm registers in vector register 310 (FIG. 3), and the third operand is a general purpose register. Processing continues with block 1102.

At block 1102, the VWRCOMPRESS instruction is decoded in decode unit 440 (FIG. 4B). Processing continues with block 1104.

At block 1104, the execution unit 462 (FIG. 4B) in the execution engine unit 450 (FIG. 4B) writes the 64 bytes of compressed data stored in one of the zmm registers to memory. Processing continues with block 1106.

At block 1106, the execution unit 462 (FIG. 4B) in the execution engine unit 450 (FIG. 4B) writes the metadata stored in a general purpose register to memory 650. Processing continues with block 1100 to fetch another instruction.

Figure 12:
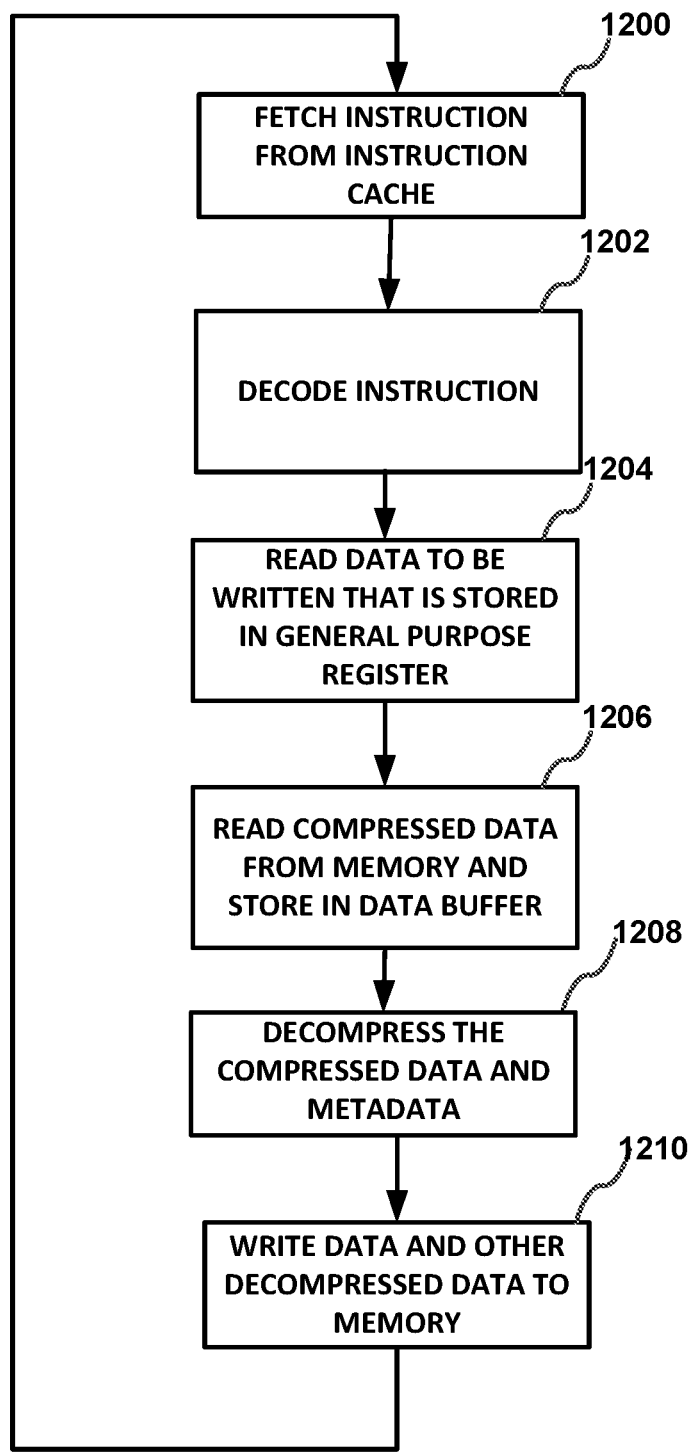
FIG. 12 is a flowgraph of the operation of the VHWCOMPRESSSTORE instruction in the SoC.

FIG. 12 is a flowgraph of the operation of the VHWCOMPRESSSTORE instruction in the SoC 600. The compressed data stored in memory 650 is typically read-only data, that is, it is data that is not written during execution of an application that uses the compressed data 710 stored in memory 650. The set of compress AVX-512 instructions includes a VHWCOMPRESSSTORE instruction in the event that compressed data may need to be modified (written) during execution of an application that uses the compressed data 710 stored in memory 650. The VHWCOMPRESSSTORE instruction performs a read-modify-write to write the data in a general purpose register to memory 650.

At block 1200, the VHWCOMPRESSSTORE instruction is fetched from instruction cache 434 (FIG. 4) by instruction fetch unit 438 (FIG. 4). The VHWCOMPRESSSTORE instruction has two operands, the first operand is an address of a compressed block in the compressed data 710 stored in memory 650 and the second operand is a general purpose register. Processing continues with block 1202.

At block 1202, the VHWCOMPRESSSTORE instruction is decoded in decode unit 440 (FIG. 4B). Processing continues with block 1204.

At block 1204, the execution unit 462 (FIG. 4B) in the execution engine unit 450 (FIG. 4B) reads 64 bytes of data stored in a general purpose memory to be written to memory. Processing continues with block 1206.

At block 1206, the execution unit 462 (FIG. 4B) in the execution engine unit 450 (FIG. 4B) stores the 64 bytes of data read from the general purpose register to be written to memory 650 in a write buffer in the compress/decompress engine 700 in the memory controller 614. Processing continues with block 1208.

At block 1208, the 512 bits of data stored in the data field 10 in the data buffer 702 are sent to the compress/decompress unit 704 to be decompressed. Processing continues with block 1210.

At block 1210, the 64 bytes of data stored in the write buffer and other decompressed data read from memory 650 are written to memory 650. Processing continues with block 1200 to fetch another instruction.

The compress AVX-512 instructions discussed in conjunction with FIGS. 9-12 can be used by Artificial Intelligence (AI) applications that use neural network weights stored in memory. The neural network weights are read-only data. After the neural network weights have been trained, offline compression can be used to compress the neural network weights and the compressed neural network weights are stored in memory. During AI application runtime, the compress AVX-512 instructions are used to read the compressed neural network weights from memory, decompress the compressed neural network weights in the compress/decompress engine, so that that the neural network weights can be used by other instructions in the processor. When there is spatial locality, a subsequent instruction to use a weight in an already-decompressed block, can read the weight stored in the decompressed block in the prefetch cache. Thus, the compress AVX-512 instructions increase the effective memory bandwidth and reduce the memory access latency of weight accesses.

In AI inference, weights are read only data. After the weights have been trained, offline compression is used to compress the weights once. Next, the VMOVRAWCOMPRESS instruction is used to read the compressed data and metadata to zmm and register. Then, the VWRCOMPRESS instruction is used to write the compressed data and metadata to memory.

Figure 13:
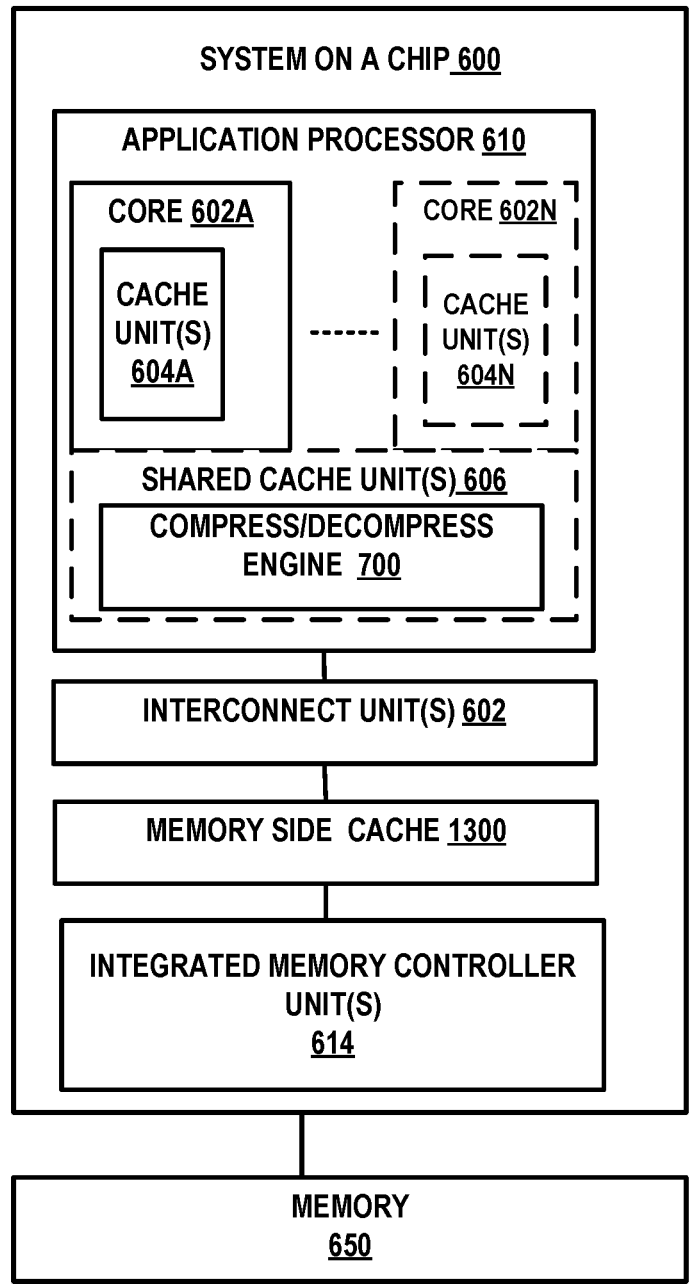
FIG. 13 is a block diagram of a portion of the SoC shown in FIG. 6 that includes the compression/decompression engine in a Level 2 (L2) cache controller in accordance with an embodiment of the present invention.

FIG. 13 is a block diagram of a portion of the SoC 600 shown in FIG. 6 that includes the compression/decompression engine 700 in a Level 2 (L2) cache controller in accordance with an embodiment of the present invention. Shared Cache unit(s) 606 include a L2 cache controller and Last Level Cache (LLC). Instead of placing the compression/decompression engine 700 in the memory controller, the compression/decompression engine 700 is in the L2 cache controller in Shared Cache unit(s) 606. After the compressed data is read from memory 650, it is stored in LLC in Shared Cache unit(s) 606 or/and memory side cache 1300 according to the cache management policy. The metadata field of an LLC and a block in memory side cache 1300 includes a compression bit. If the block is compressed, the compression bit is set to 1. If not, compressed, the compression bit is set to 0.

The compressed data that is fetched from caches/memory is decompressed in the compression/decompression engine 700 in the L2 cache controller in Shared Cache unit(s) 606. The data for the compress AVX-512 instruction is stored in the vmm register, the other decompressed adjacent data is stored in a prefetch data cache in the compression/decompression engine 700 in shared Cache unit(s) 606. In response to a subsequent request during execution of the application for an adjacent data block in the compressed read-only data block, the uncompressed adjacent block is read directly from the prefetch data cache in the compression/decompression engine 700 in shared Cache unit(s) 606.

The VHWCOMPRESSSTORE(mem, reg) instruction performs a read for ownership (RFO) operation, to read the compressed block to the L2 cache controller, decompress the block, invalidate all the compressed copies of the block in caches and write the new data to the write buffer. The new data and other decompressed data in the prefetch data cache in the compression/decompression engine 700 in shared Cache unit(s) 606 are written to the corresponding memory addresses in memory 650.

In an example, using the Frequent Pattern Compression with Limited Dictionary (FPC-D) algorithm to compress data used by an AI application that compresses cache lines to arbitrary sizes (at a byte granularity), and compresses as many lines as possible in a cache set regardless of physical cache line boundaries, the geometric mean compression ratio is 1.54. This ratio indicates the cache efficiency can significantly benefit from the use of the compress AVX-512 instructions.

Figure 14:
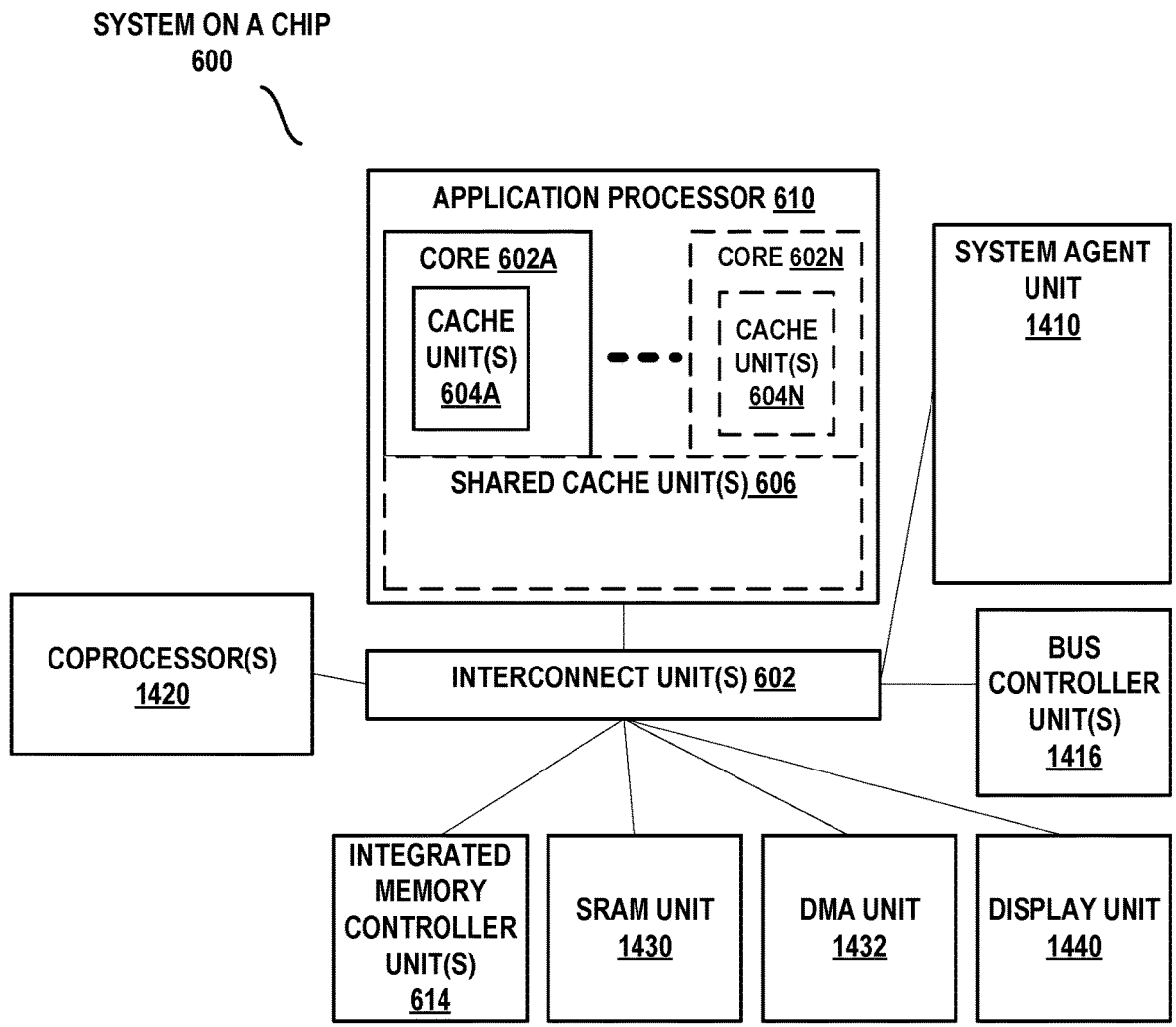
FIG. 14 is a block diagram of the SoC shown in FIG. 6.

FIG. 14 is a block diagram of the SoC 600 shown in FIG. 6.

Dashed lined boxes are optional features on more advanced SoCs. In FIG. 14, an interconnect unit(s) 602 is coupled to: a processor 610 which includes a set of one or more cores 602A-N, which include cache units 604A through 604N, and shared cache unit(s) 606; a system agent unit 1410; a bus controller unit(s) 1416; an integrated memory controller unit(s) 614; a set of one or more coprocessors 1420 which may include integrated graphics logic, an image processor, an audio processor, and a video processor; an static random access memory (SRAM) unit 1430; a direct memory access (DMA) unit 1432; and a display unit 1440 for coupling to one or more external displays. In one embodiment, the coprocessor(s) 1420 include a special-purpose processor, such as, for example, a network or communication processor, compression engine, GPGPU, a high-throughput MIC processor, embedded processor, or the like.

Figure 15:
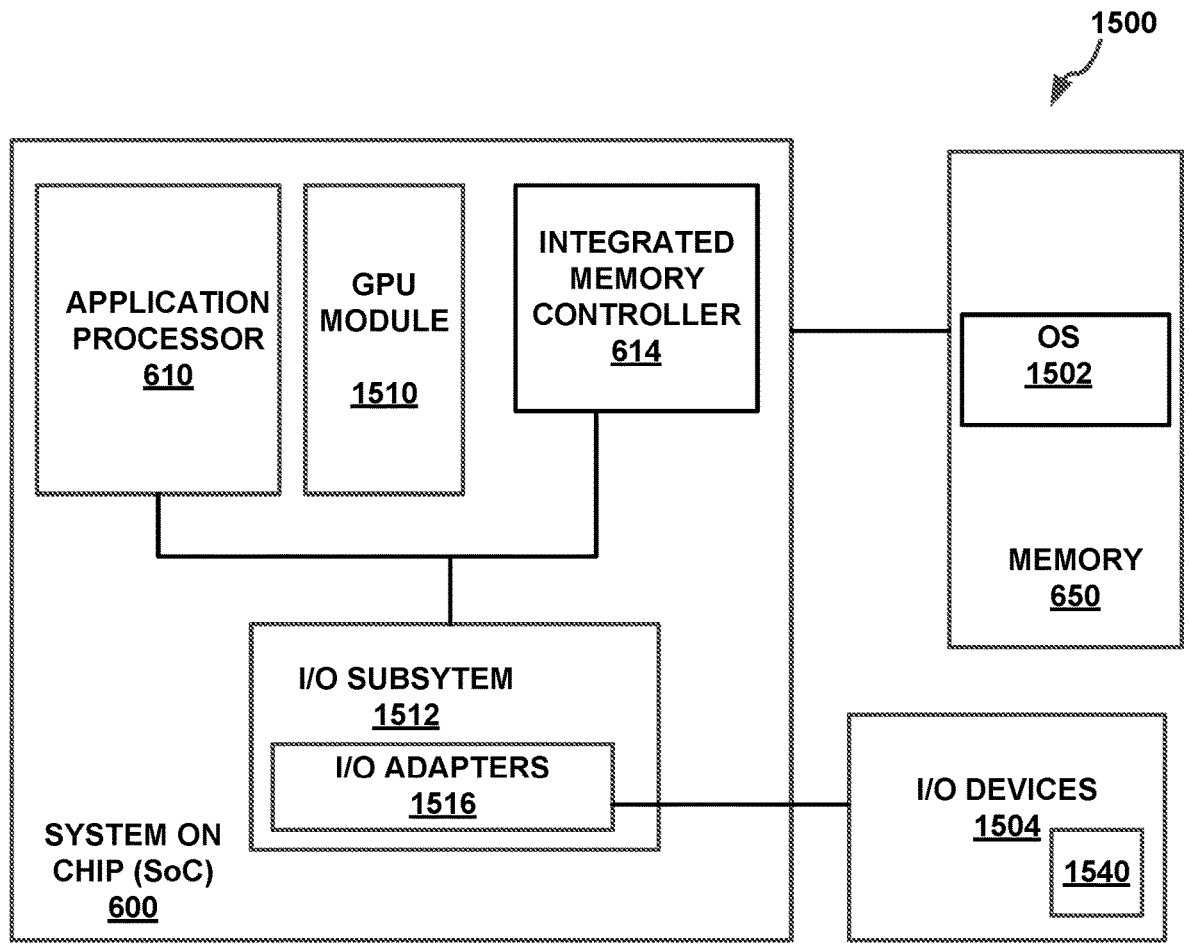
FIG. 15 is a block diagram of a system that includes the SoC shown in FIG. 6.

FIG. 15 is a block diagram of a system that includes the SoC 600 shown in FIG. 6.

Computer system 1500 can correspond to a computing device including, but not limited to, a server, a workstation computer, a desktop computer, a laptop computer, and/or a tablet computer.

The SoC 600 includes the processor 610, integrated memory controller 614, and a Graphics Processor Unit (GPU) module 1510. In other embodiments, the integrated memory controller 614 can be external to the SoC 600. The integrated memory controller 614 is communicatively coupled to memory 650 that can store an operating system 1502. An operating system 1502 is software that manages computer hardware and software including memory allocation and access to I/O devices. Examples of operating systems include Microsoft® Windows®, Linux®, iOS® and Android®.

The processor 610 can correspond to a single core or a multi-core general purpose processor, such as those provided by Intel® Corporation, according to one embodiment.

The Graphics Processor Unit (GPU) 1510 can include one or more GPU cores and a GPU cache which can store graphics related data for the GPU core. The GPU core can internally include one or more execution units and one or more instruction and data caches. Additionally, the Graphics Processor Unit (GPU) 1510 can contain other graphics logic units that are not shown in FIG. 15, such as one or more vertex processing units, rasterization units, media processing units, and codecs.

Within the I/O subsystem 1512, one or more I/O adapter (s) 1516 are present to translate a host communication protocol utilized within the processor 610 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 1516 can communicate with external I/O devices 1504 which can include, for example, user interface device(s) including a display and/or a touch-screen display 1540, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code can be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (for example, computing device, electronic system, etc.), such as recordable/non-recordable media (for example, read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (for example, application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope.

Therefore, the illustrations and examples herein should be construed in an illustrative, and not a restrictive sense. The scope of the invention should be measured solely by reference to the claims that follow.

The following examples pertain to further embodiments. Specifics in the examples may be used anywhere in one or more embodiments.

Example 1 is a processor including an instruction decoder to decode an instruction, the instruction to include a first operand and a second operand, and an execution unit coupled with the instruction decoder. The execution unit in response to the instruction to read a data block stored in the second operand and to store the second operand in a data buffer and a prefetch data cache in an engine to perform data compression and data decompression. The engine to include a compress/decompress unit to perform compression of the second operand stored in the data buffer. The engine to provide a compressed block of data and store the compressed block of data in multiple adjacent blocks in a memory.

Example 2 includes the processor of Example 1, optionally the first operand is a memory location in the memory.

Example 3 includes the processor of Example 2, optionally the engine is in the cache controller and the memory is last level cache.

Example 4 includes the processor of Example 2, optionally the processor includes an integrated memory controller, the engine is in the integrated memory controller and the memory is communicatively coupled to the processor.

Example 5 includes the processor of Example 1, optionally the data to be compressed by the engine is read-only data.

Example 6 includes the processor of Example 1, optionally the second operand is a vector register.

Example 7 includes the processor of claim 6, wherein the vector register is 512-bits.

Example 8 is a method performed by a processor including decoding an instruction in a instruction decoder of a processor, the instruction to include a first operand and a second operand; in response to the instruction, reading, by an execution unit, a data block stored in the second operand; and storing, by the execution unit, the second operand in a data buffer and a prefetch data cache in an engine to perform data compression and data decompression, the engine to include a compress/decompress unit to perform compression of the second operand stored in the data buffer, the engine to provide a compressed block of data and store the compressed block of data in multiple adjacent blocks in a memory.

Example 9 includes the method of Example 8, optionally in which the first operand is a memory location in the memory.

Example 10 includes the method of Example 9, optionally in which the engine is in a cache controller and the memory is last level cache.

Example 11 includes the method of Example 9, optionally in which the engine is in an integrated memory controller and the memory is communicatively coupled to the processor.

Example 12 includes the method of Example 8, optionally in which data to be compressed by the engine is read-only data.

Example 13 includes the method of Example 8, optionally in which the second operand is a vector register.

Example 14 includes the method of Example 13, optionally in which the vector register is 512-bits.

Example 15 is a system to process instructions including a memory to store data and instructions; and a processor coupled to the memory to execute the instructions, the processor including an instruction decoder to decode an instruction, the instruction to include a first operand and a second operand; an execution unit coupled with the instruction decoder, the execution unit in response to the instruction to read a data block stored in the second operand; and store the second operand in a data buffer and a prefetch data cache in an engine to perform data compression and data decompression, the engine to include a compress/decompress unit to perform compression of the second operand stored in the data buffer, the engine to provide a compressed block of data and store the compressed block of data in multiple adjacent blocks in a memory.

Example 16 includes the system of Example 15, optionally in which the first operand is a memory location in the memory. Example 17 includes the system of Example 16, optionally in which the engine is in a cache controller and the memory is last level cache.

Example 18 includes the system of Example 16, optionally in which the engine is in an integrated memory controller and the memory is communicatively coupled to the processor.

Example 19 includes the system of Example 15, optionally in which data to be compressed by the engine is read-only data.

Example 20 includes the system of Example 15, optionally in which the second operand is a 512-bit vector register.

Example 21 is an article including a non-transitory machine-readable storage medium. The non-transitory machine-readable storage medium storing a plurality of instructions including an instruction to perform compression, the instruction, when accessed, to cause a machine to perform operations including decode an instruction in a instruction decoder of a processor, the instruction to include a first operand and a second operand; in response to the instruction, read, by an execution unit, a data block stored in the second operand; and store by the execution unit, the second operand in a data buffer and a prefetch data cache in an engine to perform data compression and data decompression, the engine to include a compress/decompress unit to perform compression of the second operand stored in the data buffer, the engine to provide a compressed block of data and store the compressed block of data in multiple adjacent blocks in a memory.

Example 22 includes the article of Example 21, wherein the first operand is a memory location.

Example 23 includes the article of Example 22, optionally in which the engine is in a cache controller and the memory is last level cache.

Example 24 includes the article of Example 22, optionally in which the engine is in an integrated memory controller and the memory is communicatively coupled to the processor.

Example 25 includes the article of Example 21, optionally in which data to be compressed by the engine is read-only data.

Example 26 is a processor or other apparatus operative to perform the method of any one of Examples 8 to 14.

Example 27 is a processor or other apparatus that includes means for performing the method of any one of Examples 8 to 14.

Example 28 is a processor or other apparatus that includes any combination of modules and/or units and/or logic and/or circuitry and/or means operative to perform the method of any one of Examples 8 to 14.

Example 29 is an optionally non-transitory and/or tangible machine-readable medium, which optionally stores or otherwise provides instructions including a first instruction, the first instruction if and/or when executed by a processor, computer system, electronic device, or other machine, is operative to cause the machine to perform the method of any one of Examples 8 to 14.

Example 30 is a processor or other apparatus substantially as described herein. Example 31 is a processor or other apparatus that is operative to perform any method substantially as described herein.

Example 32 is a processor or other apparatus that is operative to perform any instruction substantially as described herein.

What is claimed is:

1. A processor comprising:
    an instruction decoder to decode an instruction, the instruction to include a first operand and a second operand;
    an execution unit coupled with the instruction decoder, the execution unit in response to the instruction to:
        read a data block stored in the second operand; and
        store the second operand in a data buffer and a prefetch data cache in an engine to perform data compression and data decompression, the engine to include a compress/decompress unit to perform compression of the second operand stored in the data buffer, the engine to provide a compressed block of data and to store the compressed block of data in multiple adjacent blocks in a memory.

2. The processor of claim 1, wherein the first operand is a memory location in the memory.

3. The processor of claim 2, further comprising:
    a cache controller, wherein the engine is in the cache controller and the memory is last level cache.

4. The processor of claim 2, further comprising:
    an integrated memory controller, wherein the engine is in the integrated memory controller and the memory is communicatively coupled to the processor.

5. The processor of claim 1, wherein data to be compressed by the engine is read-only data.

6. The processor of claim 1, wherein the second operand is a vector register.

7. The processor of claim 6, wherein the vector register is 512-bits.

8. A method comprising:
    decoding an instruction in a instruction decoder of a processor, the instruction to include a first operand and a second operand;
    in response to the instruction, reading, by an execution unit, a data block stored in the second operand; and
    storing, by the execution unit, the second operand in a data buffer and a prefetch data cache in an engine to perform data compression and data decompression, the engine to include a compress/decompress unit to perform compression of the second operand stored in the data buffer, the engine to provide a compressed block of data and store the compressed block of data in multiple adjacent blocks in a memory.

9. The method of claim 8, wherein the first operand is a memory location in the memory.

10. The method of claim 9, wherein the engine is in a cache controller and the memory is last level cache.

11. The method of claim 9, further comprising wherein the engine is in an integrated memory controller and the memory is communicatively coupled to the processor.

12. The method of claim 8, wherein data to be compressed by the engine is read-only data.

13. The method of claim 8, wherein the second operand is a vector register.

14. The method of claim 13, wherein the vector register is 512-bits.

15. A system comprising:
    a memory to store data and instructions; and
    a processor coupled to the memory to execute the instructions, the processor comprising:
        an instruction decoder to decode an instruction, the instruction to include a first operand and a second operand;
        an execution unit coupled with the instruction decoder, the execution unit in response to the instruction to:
            read a data block stored in the second operand; and
            store the second operand in a data buffer and a prefetch data cache in an engine to perform data compression and data decompression, the engine to include a compress/decompress unit to perform compression of the second operand stored in the data buffer, the engine to provide a compressed block of data and to store the compressed block of data in multiple adjacent blocks in the memory.

16. The system of claim 15, wherein the first operand is a memory location in the memory.

17. The system of claim 16, further comprising:
    a cache controller, wherein the engine is in the cache controller and the memory is last level cache.

18. The system of claim 16, further comprising:
    an integrated memory controller, wherein the engine is in the integrated memory controller and the memory is communicatively coupled to the processor.

19. The system of claim 15, wherein data to be compressed by the engine is read-only data.

20. The system of claim 15, wherein the second operand is a 512-bit vector register.

21. An article including a non-transitory machine-readable storage medium, the non-transitory machine-readable storage medium storing a plurality of instructions including an instruction to perform compression, the instruction, when accessed, results in a machine performing:
- decoding the instruction in a instruction decoder of a processor, the instruction to include a first operand and a second operand;
- in response to the instruction, reading, by an execution unit, a data block stored in the second operand; and
- storing, by the execution unit, the second operand in a data buffer and a prefetch data cache in an engine to perform data compression and data decompression, the engine to include a compress/decompress unit to perform compression of the second operand stored in the data buffer, the engine to provide a compressed block of data and store the compressed block of data in multiple adjacent blocks in a memory.

22. The article of claim 21, wherein the first operand is a memory location.

23. The article of claim 22, wherein the engine is in a cache controller and the memory is last level cache.

24. The article of claim 22, further comprising wherein the engine is in an integrated memory controller and the memory is communicatively coupled to the processor.

25. The article of claim 21, wherein data to be compressed by the engine is read-only data.

* * * * *